(12) United States Patent
Frosien

(10) Patent No.: US 6,509,569 B1
(45) Date of Patent: Jan. 21, 2003

(54) DEFLECTION ARRANGEMENT FOR SEPARATING TWO PARTICLE BEAMS

(75) Inventor: Jurgen Frosien, Riemerling (DE)

(73) Assignee: Advantest Corp., Tokyo (JP)

(*) Notice: Subject to any disclaimer, the term of this patent is extended or adjusted under 35 U.S.C. 154(b) by 110 days.

(21) Appl. No.: 09/690,425

(22) Filed: Oct. 17, 2000

(30) Foreign Application Priority Data

Nov. 12, 1999 (EP) .......................................... 99122581

(51) Int. Cl.$^7$ ................................................. H01J 3/26
(52) U.S. Cl. ............ 250/396 R; 250/310; 250/396 ML
(58) Field of Search .......................... 250/396 R, 310, 250/396 ML

(56) References Cited

U.S. PATENT DOCUMENTS

| | | | | |
|---|---|---|---|---|
| 4,362,945 A | * | 12/1982 | Riecke | 250/396 R |
| 4,590,379 A | * | 5/1986 | Martin | 250/396 R |
| 4,882,486 A | * | 11/1989 | Kruit | 250/305 |

FOREIGN PATENT DOCUMENTS

| | | |
|---|---|---|
| EP | 0 817 235 A1 | 1/1998 |
| EP | 0 917 177 A1 | 5/1999 |

OTHER PUBLICATIONS

"Surface Imaging with LEEM" W. Telieps. Applied Physics, Sep. 1987, pp 55–61.

* cited by examiner

Primary Examiner—Bruce Anderson
Assistant Examiner—Zia R. Hashmi
(74) Attorney, Agent, or Firm—Muramatsu & Associates

(57) ABSTRACT

A deflection arrangement for separating two parties beams has an electrostatic deflector and a magnetic deflector having a common optical axis and generating crossed electrostatic and magnetic deflection fields, wherein the two particle beams pass the deflection arrangements from opposite sides. The two deflectors are adapted to deflect one of the two beams achromatically by an angle s and the ocher beam by an angle $\beta \geq 3\alpha$ with respect to its angle of incidence, respectively.

10 Claims, 2 Drawing Sheets

DEFLECTION ARRANGEMENT FOR SEPARATING TWO PARTICLE BEAMS

Figure 1:
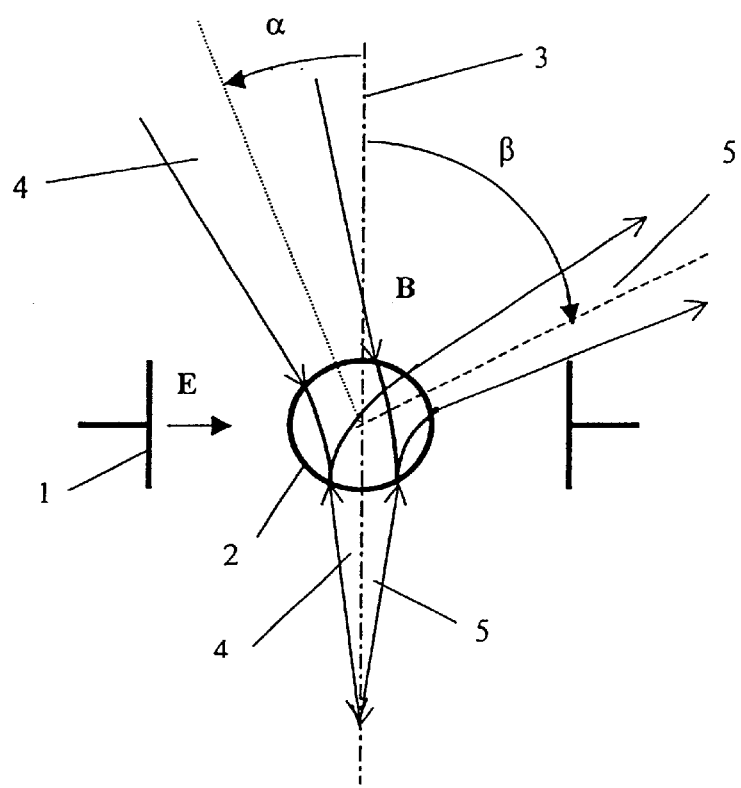

The invention is related to a deflection arrangement for separating ewe particle beams and a particle beam system with such a deflection arrangement.

In particle beam systems, especially in high-resolution B-beam systems, there is the task of separating illuminating particles (primary particle beam and signal particles (secondary particle beam) generated by the illuminating particle. This general task of separating beans has to be performed both in scanning systems (like SEM's) and in parallel imaging systems (like LEEM's).

The following components are frequently used as beam separators in known arrangements:
  magnetic sector fields,
  electrostatic and magnetic deflectors in one, two or three stages and
  Wien filter.

In surface imaging tools having a wider beam, complete image fields are illuminated with an illumination particle beam, and signal particles, e.g. secondary particles, backscattered particles, reflected particles or other particles released at the specimen are imaged by a detector on which a complete image of the surface area is generated. N. Telieps, "Surface Imaging with LEEM", Appl. Phys. A 44, 55–61, 1987, discloses such a surface imaging tool. The primary particle beam and the secondary particle beam are deflected by a magnetic sector field. The angle of incidence of the primary particle beam is a with respect to the optical axis and the beam will be deflected by the magnetic sector field onto the optical axis while the secondary particle beam reflected from the specimen rill be deflected to the ocher side of the optical axis to separate the secondary particle beam from the primary particle team.

Magnetic sector fields, however, introduce chromatic aberration, which limits the resolution. In order to keep the resolution reasonable, only small separation angles can be achieved.

EP-A-0 817 235 relates to a scanning electron microscope that obtains a scan image on the basis of secondary electrons emitted by irradiating an electron beam to a specimen. This microscope uses a Wien filter to separate the primary electron beam fray she secondary electrons. A Wien filter generates a crossed electro-static and magnetic deflection field, which, however, also introduces chromatic aberration. Only in the case that a crossover or an image of the surface is situated in the center of the Wien filter, chromatic aberration can be cancelled out. This however, restricts the optical design.

Electrostatic and magnetic deflectors can be arranged to an achromatic arrangement. This, however, requires at lease a two stage or three stage arrangement as disclosed in SP-A-0 937 177. Optical systems with many deflection system, however, extent the length of the optical system which has a negative influence on the particle bear interaction and consequently on the image resolution.

It is therefore an object of the invention to provide a deflection arrangement for separating two particle beams according to the preamble to claim 1 or a particle beam system with such a deflection arrangement according to the preamble to claim 8 which provides an achromatic operation and a good image resolution.

The object is solved by the features of claims 1 and 8.

Further embodiments of the invention are the subject matter of the subordinate claims.

According to the invention, the deflection arrangement for separating two particle beams has an electrostatic deflector and a magnetic deflector having a common optical axis and generating crossed electrostatic and magnetic deflection fields, wherein the two particle beams pass the deflection arrangement from opposite sides. The two deflectors are adapted to deflect one of the two beams achromatically by an angle $\alpha$ and the ocher beam by an angle $\beta \geq 3\alpha$ with respect to the angle of incidence, respectively.

In one embodiment of she invention, the deflection arrangement is positioned in a crossover of one of the two beams, preferably in a crossover of the beam which is not deflected achromatically. With such an arrangement, the chromatic aberration can be cancelled out for both beams.

In a preferred embodiment, the deflection fields of the electrostatic deflector and the magnetic deflector are superimposed, similar to an arrangement in a Wien filer. The major difference to a common Wien filter, however, is the excitation of the electrostatic and magnetic deflector:

1. The magnetic deflection is defined by:

$$\alpha m = C_m H U_0^{-0.5} \tag{1}$$

$$d\alpha_m = 0.5 * C_m H U_0^{-1.5} * dU_0 = -0.5 * \alpha_m dU_0 \tag{2}$$

$$d\alpha_m / \alpha_m = 0.5 \, dU_0 / U_0 \tag{3}$$

$\alpha_m$=magnetic deflection angle
$C_m$=geometric data of the magnetic deflector
H=magnetic field strength
$U_0$=acceleration voltage of the primary particle
$d\alpha_m$=variation of the deflection angle by varying the primary energy by $dU_0$ 2. The electrostatic deflection is defined by:

$$\alpha_e = C_e * U_D * U_0^{-1} \tag{4}$$

$$d\alpha_e = -C_e * U_D * U_0^{-1} * dU_0 = -\alpha_e * dU_0 \tag{5}$$

$$d\alpha_e / \alpha_e = -dU_0 / U_0 \tag{6}$$

$\alpha_e$=electrostatic deflection angle
$C_e$=geometric data of the electrostatic deflector
H=magnetic field strength
$U_0$=acceleration voltage of the primary particle
$d\alpha_m$=variation of the deflection angle by varying the primary energy by $dU_0$ 3. Superposition of electrostatic and magnetic deflector:

$$d\alpha = (-\alpha_e - 0.5\alpha_m) dU_0 / U_0 \tag{7}$$

$d\alpha$=variation of the total deflection angle of the superimposed electrostatic end magnetic deflects by varying the primary energy by $dU_0$ An achromatic deflector can be realized if $d\alpha=0$. This is true, if the excitation of the magnetic deflector is double as high in amplitude as that one of the electrostatic deflector. The deflection direction of both systems is opposite. The effect of such an arrangement is that the magnetic deflector tries to the deflect the beam by an angle of 2 $\alpha$, while the electrostatic deflector beds the beam back by $\alpha$. The resulting deflection power of this arrangement is $\alpha$. Since the chromatic aberration of the electrostatic deflector is twice as high as tat one of the magnetic deflector, the resulting deflection is achromatic, independent of the beam trace.

For the beam coming from the opposite direction, electrostatic and magnetic deflection forces are working in the same direction, which means that this beam is deflected by at least 3 $\alpha$. The total separation angle of the two beams is consequently at least 4 $\alpha$.

The achromatic deflection is only the for one beam. For the other beam, the energy dispersion of the two superimposed deflectors will even add. This, however, is in most cases no drawback, because resolution requirements for one of the two beams are of less importance.

In case that chromatic compensation is required for both beams, the arrangement and the corresponding excitation of the two deflection offers also a solution. In this case, the beam which is not achromatically deflected has to provide a crossover in the center of the deflection arrangement. In this case, the chromatic aberration of the second beam is also compensated.

Further advantages and embodiments of the invention will now be described in more detail with reference to the drawings.

In the drawings

Figure 2:
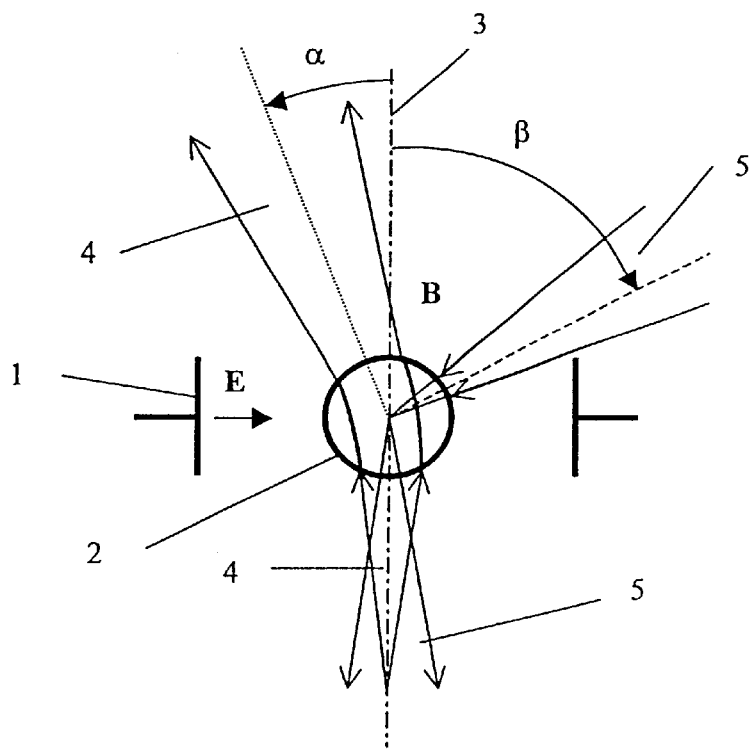
Figure 3:
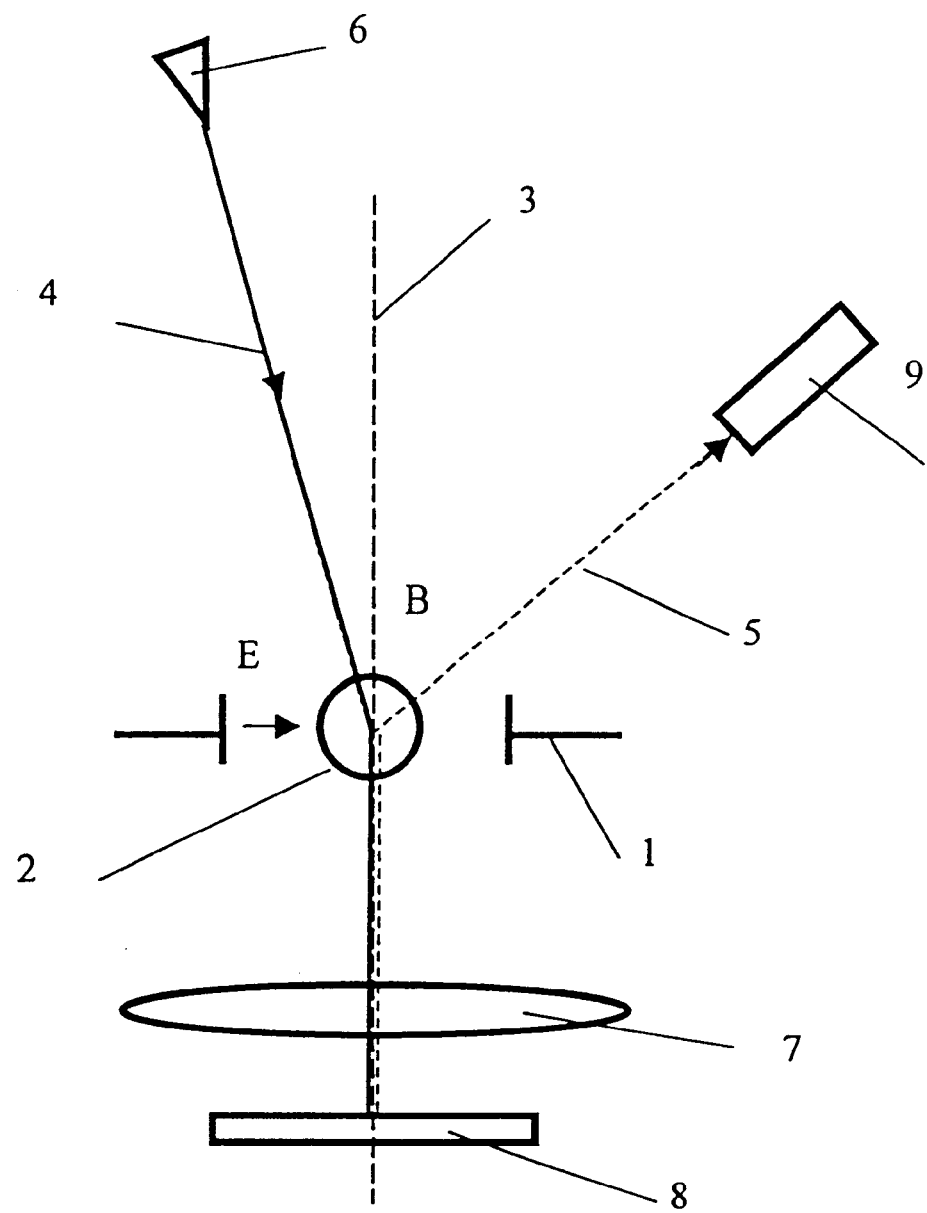

FIG. 1 shows a schematic representation of the deflection arrangement according to a first embodiment, FIG. 2 shows a schematic representation of the deflection arrangement according to a second embodiment and FIG. 3 shows a schematic representation of a particle beam system with a deflection arrangement according to the invention.

FIG. 1 discloses a deflection arrangement for separating two particle beams with an electrostatic deflector 1 and a magnetic deflector 2 paving a common optical axis and generating crossed electrostatic and magnetic deflection fields E, B, wherein two particle beams 4, 5 pass the deflection arrangement from opposite aides.

The two deflectors 1, 2 are adapted to deflect one of the two beams 4 achromatically by an angle $\alpha$ and the other beam 5 by an angle $\beta \geq 3\alpha$ with respect to its angle of incidence, respectively.

The deflection fields E, B of the electrostatic deflector 1 and the magnetic deflector 2 are superimposed.

The excitation of the magnetic deflector 2 is twice as high in amplitude as the excitation of the electrostatic deflector 1. The deflection direction of the two deflectors 1, 2 is opposite. As a consequence, the first beam 4, whose angle of incidence with respect to the optical axis 3 is $\alpha$, will be deflected by the magnetic deflector 4, by an angle of $-2\alpha$, while the electrostatic deflector 1 bends the beam back by $\alpha$. Accordingly, the resulting deflection of the first beam 4 is $\alpha$. If the angle of incidence of the first beam is $\alpha$, the exit angle is 0° with respect to the optical axis 3.

Since the chromatic aberration of the electrostatic deflector 1 is double de high as that one of the magnetic deflector 2, the resulting deflection is achromatic.

The second particle beam 5 enters the deflection arrangement from below and its angle of incidence is 0° with respect to the optical axis 3. In this case, both deflectors will deflect to particle beam in the same direction, which means that the second beam 5 is deflected by $\beta \geq 3\alpha$. Consequently, the total separation angle of the first and second beam 4, 5 is at least $4\alpha$.

It should be noted that the second particle beam 5 in the embodiment according to FIG. 1 is not chromatically compensated. In contrary, energy dispersion of the two superimposed deflectors 1, 2 will even add. This, however, is in most cases no drawback because resolution requirements for one of the two beams are of less importance.

In the case that chromatic compensation is required for both beams, the deflection arrangement is to be positioned in a crossover of the beam, which is not deflected achromatically.

FIG. 2 discloses such an arrangement, where the deflection arrangement is positioned within the crossover of the second beam 5. Furthermore, the angle of incidence of the first particle beam 9 which is to be deflected achromatically, is 0°. Consequently, its exit angle is $\alpha$ with respect to the optical axis 3. Because of the arrangement of the deflection arrangement in a crossover of the second beam 5, the chromatic aberration of the second beam 5 can also be compensated.

If the two beams 4, 5 have the same energy, the angle $\beta$ of the second beam 5 is 3 $\alpha$. In the case that the energy of the first beam 4 is higher than the second beam 5, the deflection angle $\beta$ of the second beam 5 is higher than 3 =.

Of course, it is not absolutely necessary to have superimposed deflection fields of the electrostatic and magnetic deflectors. It would also be possible to arrange the two deflectors close together along the optical axis 3.

The embodiments of the FIGS. 1 and 2 differ from each other in the direction of the two particle beams and in that in one case, the deflection arrangement is arranged within the crossover of the particle beam which is not deflected achromatically. However, it is obvious that it would also be possible to arrange the embodiment according to FIG. 1 in a crossover of the second particle beam s and not to arrange the embodiment according to FIG. 2 in the crossover of the second particle beam 5.

The deflection arrangement described above can be used advantageously in a particle beam system, i.e. an electron beam measuring system.

FIG. 3 discloses schematically a particle beam system with a source 6 for generating a primary particle beam 4,
an optical unit, comprising an objective lens 7 for directing the primary particle beam 4 to a specimen 8,
a detector 9 for detecting a secondary particle beam 5, consisting of secondary, backscattered and/or reflected particles released at the specimen 8 and
a deflection arrangement between the specimen 8 and the detector 9 for separating the primary particle beam 9 and the secondary particle beam 5.

The deflection arrangement, for example, is formed by one of the two deflection arrangements according to FIGS. 1 or 2.

Accordingly the deflection arrangement has an electrostatic deflector 1 and a magnetic deflector 2 having a common optical axis 3 and generating crossed electrostatic and magnetic deflection fields E, B, wherein the primary particle beam 9 and the secondary particle beam 5 pass the deflection arrangement from opposite sides. The two deflectors are adapted to deflect one of the two beams achromatically by an angle $\alpha$ and the other beam by an angle $\beta \geq 3$ $\alpha$ with respect to its angle of incidence, respectively.

In FIG. 3, it is the primary particle beam which, is deflected achromatically. However, it would also be possible that the particle beam which is deflected achromatically is the secondary particle beam.

The deflection arrangement according to the invention is short and compact in order not to extent the length of the particle beam system. Furthermore, it is single in design and guarantees an unsophisticated operation. Furthermore, at least one beam, if necessary both beams can be deflected achromatically which guarantees a good resolution of the particle beam system.

What is claimed is:

1. A deflection arrangement for separating two particle beams comprising:
   an electrostatic deflector; and
   a magnetic deflector;
   wherein the electrostatic deflector and the magnetic deflector have a common optical axis and generate crossed electrostatic and magnetic deflection fields;

wherein the two particle beams pass the deflection arrangement from opposite sides; and wherein the two deflectors are adapted to deflect one of the two beams achromatically by an angle $\alpha$ and the other beam by an angle $\beta \geq 3\alpha$, with respect to its angle of incidence, respectively.

2. A deflection arrangement according to claim 1, wherein the deflection arrangement is positioned in a crossover of one of the two beams.

3. A deflection arrangement according to claim 1, wherein the deflection arrangement is positioned in a crossover of the beam which is not deflected achromatically.

4. A deflection arrangement according to claim 1, wherein the deflection fields of the electrostatic deflector and the magnetic deflector are superimposed.

5. A deflection arrangement according to claim 1, wherein the angle of incidence of the beam, which is to be deflected achromatically is $\alpha$ and its exit angle is 0° with respect to the optical axis.

6. A deflection arrangement according to claim 1, wherein the angle of incidence of the beam, which is to be deflected achromatically, is 0° and its exit angle is $\alpha$ with respect to the optical axis.

7. A deflection arrangement according to claim 1, wherein the angle $\beta$ of the other beam is $3\alpha$ if the two beams have the same energy.

8. A particle beam system comprising;
    a source for generating a primary particle beam;
    an optical unit for directing the primary particle beam to a specimen;
    a detector for detecting a secondary particle team, consisting of secondary, backscattered and/or reflected particles; and
    a deflection arrangement between the specimen and the detector for separating the primary particle beam and the secondary particle beam;
    wherein the deflection arrangement is constituted according to claim 1.

9. A particle beam system according to claim 8, wherein the particle beam which is deflected achromatically is the secondary particle beam.

10. A particle beam system according to claim 8, wherein the particle beam which is deflected achromatically is the primary particle beam.

* * * * *